United States Patent
Steinmetz et al.

(10) Patent No.: US 10,458,012 B2
(45) Date of Patent: Oct. 29, 2019

(54) METHOD FOR MANUFACTURING A COMPONENT

(71) Applicant: Caterpillar Inc., Peoria, IL (US)

(72) Inventors: Andrew Douglas Steinmetz, Peoria, IL (US); Douglas Trent Weaver, Brimfield, IL (US); Roger Lee Recker, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 311 days.

(21) Appl. No.: 15/145,203

(22) Filed: May 3, 2016

(65) Prior Publication Data

US 2017/0321315 A1 Nov. 9, 2017

(51) Int. Cl.
| | |
|---|---|
| *C23C 4/18* | (2006.01) |
| *C23C 14/58* | (2006.01) |
| *F16C 33/04* | (2006.01) |
| *B62D 55/21* | (2006.01) |
| *F16C 11/04* | (2006.01) |
| *B62D 55/088* | (2006.01) |

(52) U.S. Cl.
CPC .............. *C23C 4/18* (2013.01); *B62D 55/21* (2013.01); *C23C 14/5873* (2013.01); *F16C 33/04* (2013.01); *B62D 55/0887* (2013.01); *F16C 11/04* (2013.01); *F16C 2220/24* (2013.01); *F16C 2223/42* (2013.01); *F16C 2223/60* (2013.01); *F16C 2223/70* (2013.01); *F16C 2350/26* (2013.01)

(58) Field of Classification Search
CPC ........... C23C 4/12; C23C 4/123; C23C 4/126; C23C 4/129; C23C 4/131; C23C 4/134; C23C 4/137; C23C 4/14; C23C 4/16; C23C 4/02; C23C 4/18; C23C 4/185
USPC ....... 427/446, 447, 448, 449, 450, 451, 452, 427/453, 454, 455, 456, 299, 307, 327
See application file for complete search history.

(56) References Cited

U.S. PATENT DOCUMENTS

| | | | |
|---|---|---|---|
| 5,693,234 A * | 12/1997 | Peters | G01L 9/0042 |
| | | | 216/2 |
| 6,045,200 A | 4/2000 | Anderton et al. | |
| 6,053,034 A | 4/2000 | Tsui et al. | |
| 6,102,408 A | 8/2000 | Anderton et al. | |
| 6,819,588 B2 | 11/2004 | Baumeister et al. | |
| 6,948,784 B2 | 9/2005 | Wodrich et al. | |
| 7,716,836 B2 | 5/2010 | Bischof et al. | |
| 8,146,340 B2 | 4/2012 | Shimada et al. | |
| 8,186,210 B2 | 5/2012 | Hangen | |
| 9,316,341 B2 * | 4/2016 | Kusinski | F16L 58/08 |
| 2003/0183021 A1 | 10/2003 | Holmberg | |
| 2006/0163217 A1 * | 7/2006 | Jiang | C23C 4/12 |
| | | | 219/121.46 |
| 2006/0191406 A1 * | 8/2006 | Kucher | F15B 15/2807 |
| | | | 92/5 R |
| 2015/0197295 A1 | 7/2015 | Feng et al. | |

\* cited by examiner

*Primary Examiner* — Dah-Wei D. Yuan
*Assistant Examiner* — Nga Leung V Law

(57) ABSTRACT

A method for manufacturing a component is provided. The method includes providing one or more notches on a surface of the component. Further, depositing a coating on the surface to provide a thickness of the coating on the surface, is performed. The method also includes removing, at least partially, the coating from the surface such that the thickness of the coating over the notches is different from the thickness of the coating on the surface adjacent to the notches.

11 Claims, 5 Drawing Sheets

METHOD FOR MANUFACTURING A COMPONENT

TECHNICAL FIELD

The present disclosure relates to a component, and more particularly to a method for manufacturing a component for creating fracture zones in a coating secured on a surface of the component.

BACKGROUND

Components such as track bushings used in the track pins for linking track links in an endless track of a track type machine, such as an earthmoving machine, are subjected to severe operating environment. The ends of the track bushing and the inner surface of the track bushing adjacent its two ends are the main bearing surfaces that respectively slide against the track seal and the track pin. Dirt and debris tend to wear the ends of the track bushings sliding against the sealing surface of a track seal.

Therefore, a coating is generally provided on the ends of the track bushing. The coating may be of a corrosion and abrasion resistant material that prevents the corrosion and erosion of the ends of the track bushing. The coating may also improve surface finish of the ends of the track bushing so that they are more resistant to friction and wear. However, the coating is susceptible to damage during assembly and disassembly of track links. During assembly or disassembly of bushing with track links, the edges of the coating may rip off from the bushing. This rip off may progress along the entire surface of the bushing and causes chipping of the coating from the entire surface of the bushing. This may reduce the life of the bushing, which is undesirable.

U.S. Pat. No. 6,819,588 discloses a method for providing memory elements on a substrate. The memory elements are provided by partially removing the coating from various locations on substrate and thereby forming protrusion on the surface. However, providing the memory elements on a substrate by partially removing the coating is different from controlling chipping of the coating from a surface of a component.

SUMMARY OF THE INVENTION

According to an aspect of the disclosure, a method for manufacturing a component is disclosed. The method includes providing one or more notches on a surface of the component. Thereafter, depositing a coating on the surface to provide a thickness of the coating on the surface is carried out. Next, the method includes removing, at least partially, the coating from the surface such that the thickness of the coating over the notches is different from the thickness of the coating on the surface adjacent to the notches.

According to another aspect of the disclosure, a bushing for a track link assembly of a machine is provided. The bushing includes an end face that has a surface. The surface includes one or more notches. A coating is secured on the surface, where a thickness of the coating secured over each of the notches is different from a thickness of the coating over the surface adjacent to the each of the notches.

According to another aspect of the disclosure, a component with a surface, is disclosed. The component has a coating secured on the surface. Further, one or more fracture zones for controlling chipping of the coating from the surface is also provided. The fracture zones include a different thickness of the coating relative to a thickness of the coating adjacent to the fracture zones.

DETAILED DESCRIPTION

The present disclosure relates generally to a component for a machine. The machine may be an excavator, a wheel loader, a track type tractor, a rotary mixer or any other machine such as a construction machine, a mining machine, an agricultural machine, etc. In a specific embodiment, the present disclosure relates to a bushing for a track link assembly of a track type machine, such as an excavator or a track type tractor. While the following description relates to a bushing for an endless track, a person having ordinary skill in the art should readily understand that the present disclosure may be adapted for various other components of various other machines.

Figure 1:
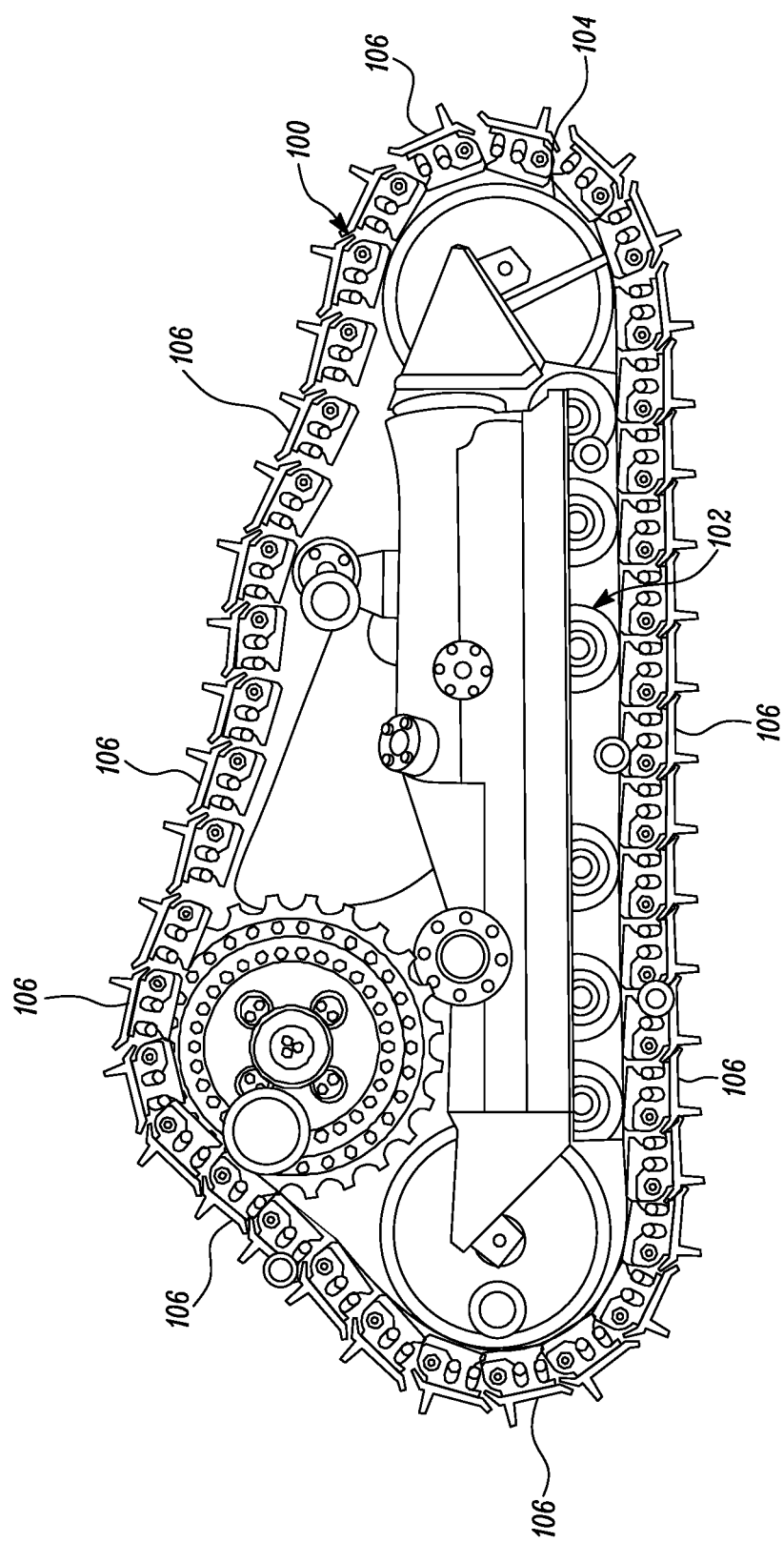
FIG. 1 illustrates a view of an exemplary track link assembly, in accordance with an embodiment of the disclosure.

Referring to FIG. 1, one exemplary embodiment of a track link assembly 100 for a machine is illustrated. As shown, the track link assembly 100 is entrained about a track roller frame 102 of the machine. The track link assembly 100 engages a drive sprocket that provides motive force to the track link assembly 100, which in turn, drives the machine in a well known manner. The track link assembly 100 may also be entrained about an idler 104 that supports the track link assembly 100 on one end of the track roller frame 102.

The track link assembly 100 includes a plurality of track links 106 that have a first end portion 108 and a second end portion 110. The track link assembly 100 is formed by coupling the first end portion 108 of each of the track links 106 to the second end portion 110 of each of the track links 106. The first end portion 108 and the second end portion 110 are coupled together by using a pin 112.

Figure 2:
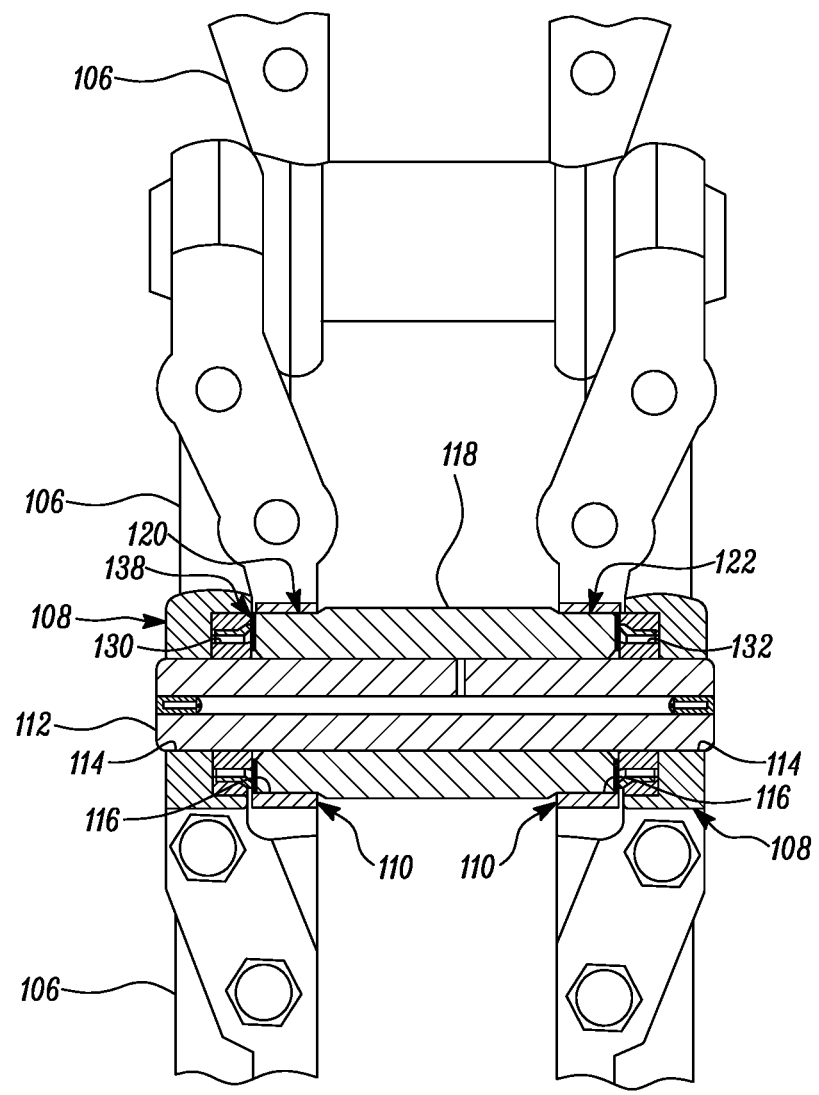
FIG. 2 illustrates a portion of the track link assembly depicting an assembly of two track links, in accordance with an embodiment of the disclosure.

As shown in FIG. 2, the pin 112 is inserted inside bores 114 and 116 of the first end portion 108 and the second end portion 110, respectively, to pivotally couple the track links 106. The pin 112 may be secured to the first end portion 108 of the track links 106 by interference fit within the bores 114.

Further, a component such as a bushing 118 is positioned about the pin 112. The bushing 118 includes a first end portion 120, a second end portion 122, and a bore 124. The first end portion 120 and the second end portion 122 are positioned within the bores 116 and are secured to the second end portion 110 by interference fit or other suitable securing means. The bore 124 extends through the bushing 118 between its respective end portions 120, 122 and is of a sufficient diameter to receive the pin 112 to allow relative rotation between the pin 112 and the bore 124.

The bushing 118 further includes a first end face 126 and a second end face 128. The first end face 126 and the second end face 128 abut a first seal member 130 and a second seal member 132, respectively. For ease in understanding and reference, further description is focused towards aspects of the first end face 126 alone. However, it will be understood that the aspects disclosed for the first end face 126 is equivalently applicable to the second end face 128 as well.

Figure 3:
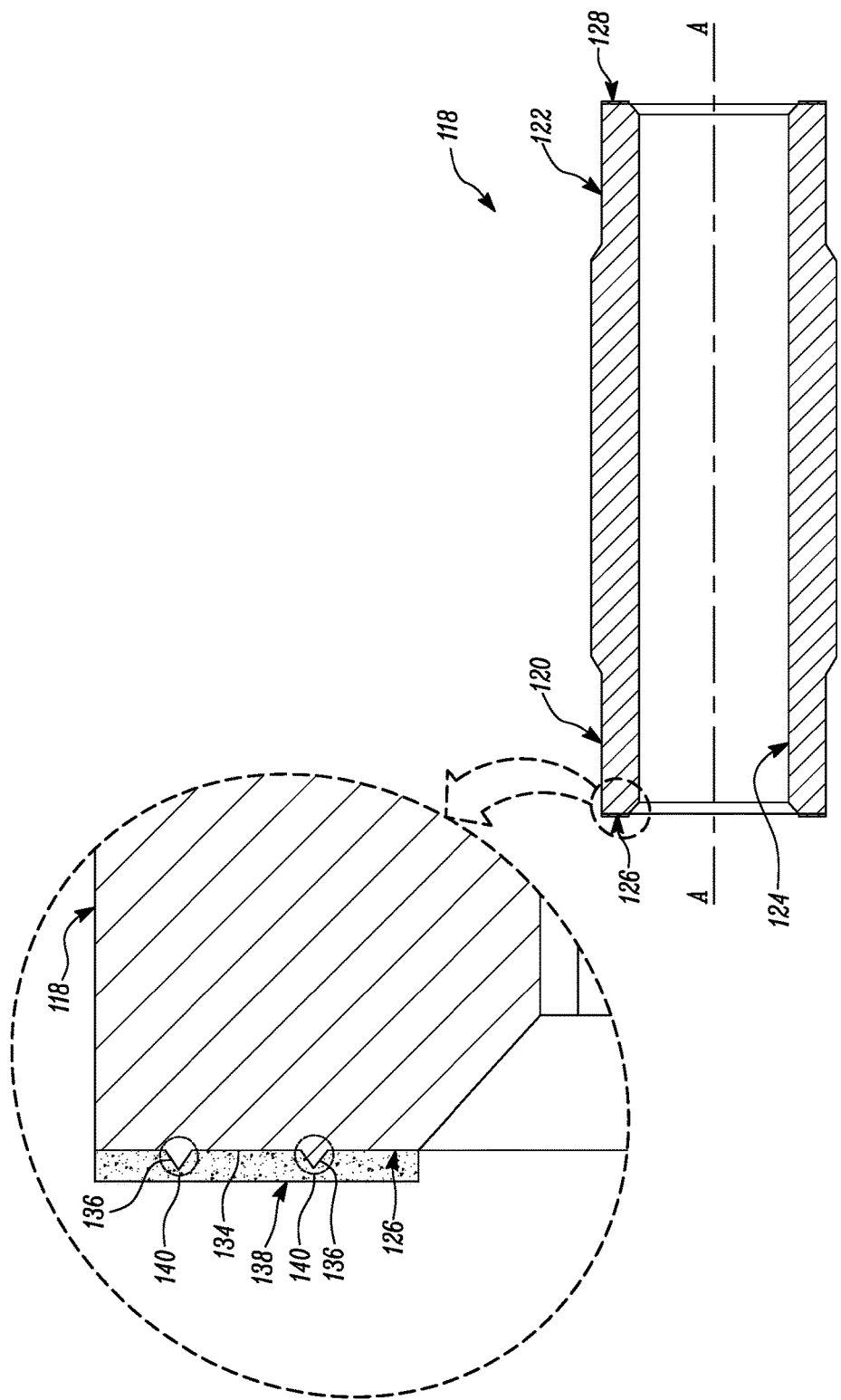
FIG. 3 illustrates a sectional view of a bushing of the track link assembly, in accordance with an embodiment of the disclosure.

Referring to FIG. 3, the first end face 126, hereinafter referred to as an end face 126, includes a surface 134. The surface 134 includes one or more notches 136. The notches 136 may extend around a central axis A-A of the bushing 118. Further, a coating 138 is secured on the surface 134. The coating 138 is secured to the surface 134 by depositing a suitable wear and abrasion resistant material on the surface 134. Further, the coating 138 includes one or more fracture zones 140 to control chipping of the coating 138 from the surface 134, such as during an assembly of the bushing 118 into the bores 116. The fracture zones 140 includes a different thickness of the coating 138 relative to the surface 134 adjacent to the fracture zones 140. As shown in FIG. 3, each of the fracture zones 140 corresponds to an area of the coating 138 above each of the notches 136 that extend along the notches 136. As shown in FIG. 3, the notches 136 are protrusions extending outwardly from the surface 134. In such a case, the thickness of the coating 138 above the notches 136 is less than the thickness of the coating 138 above the surface 134 adjacent to the notches 136. The thickness of the coating 138 at the fracture zones 140 or above the notches 136 is reduced by removing, at least partly, the coating 138. In an embodiment, the coating 138 may be omitted above the notches 136. As, the coating 138 above the notches is omitted, there is a zero thickness of the coating 138 above the notches 136 which is different than the thickness of the coating 138 on the surface 134 adjacent to the notches 136. In such a case, the surface 134 corresponding to the notches 136 is exposed. The exposed surface 134 above the notches 136 creates the fracture zones 140 for chipping of the coating 138.

Figure 4:
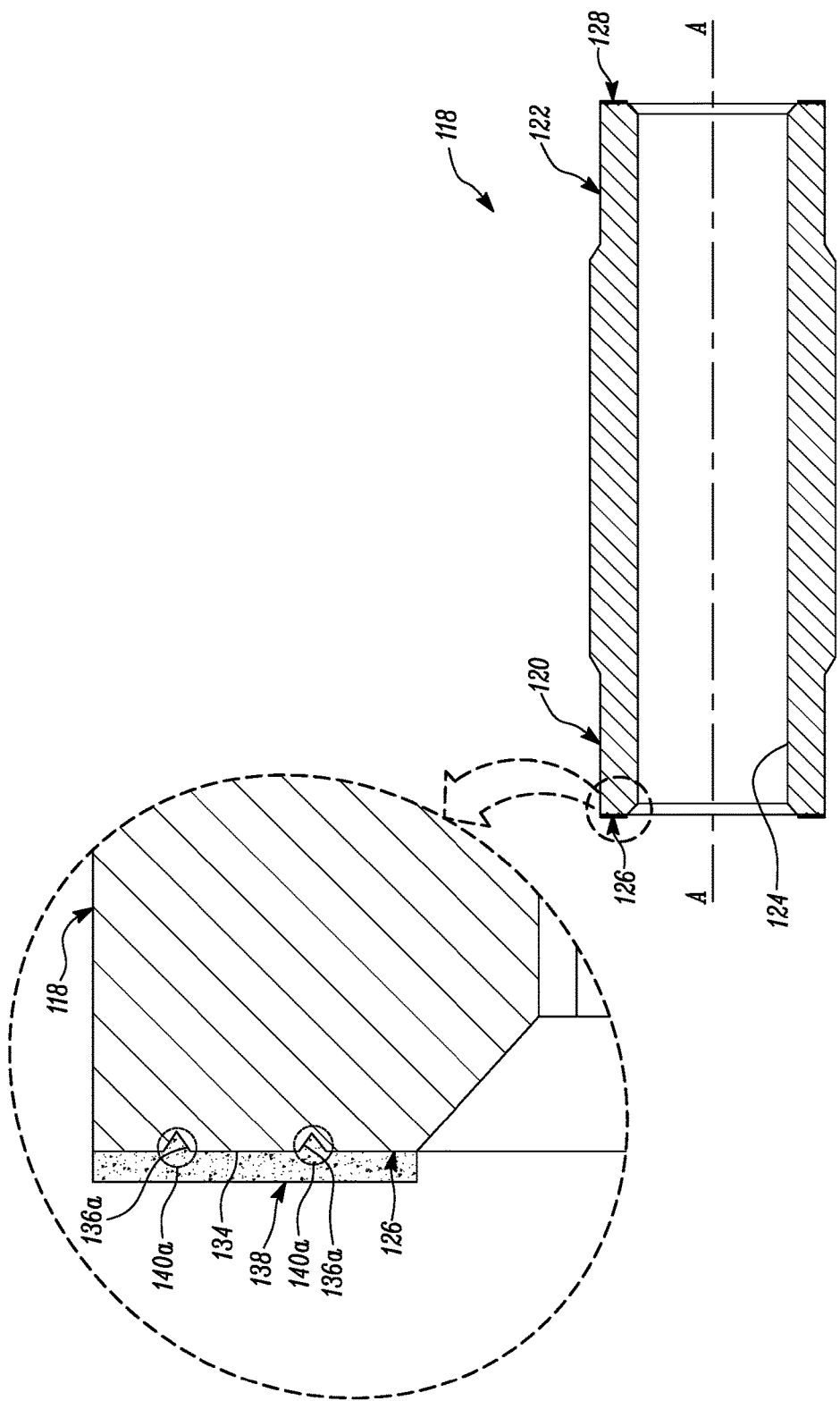
FIG. 4 illustrates a sectional view of a bushing of the track link assembly in accordance with an alternative embodiment of the disclosure.

Referring to FIG. 4, a bushing 118a is shown according to alternative embodiment of the disclosure. The bushing 118a includes one or more notches 136a that are grooves formed on the surface 134 of the bushing 118a. The notches 136a may extend around a central axis A-A of the bushing 118a. Further, the coating 138 includes one or more fracture zones 140a to control chipping of the coating 138 from the surface 134. The fracture zones 140a include a different thickness of coating 138 relative to the surface 134 adjacent to the fracture zones 140a. The fracture zones 140 correspond to an area of the coating 138 above the notches 136a and extend along the notches 136a. In the illustrated embodiment, the thickness of the coating 138 over the notches 136a is more than the thickness of the coating 138 above the surface 134 adjacent to the notches 136a.

Figure 5:
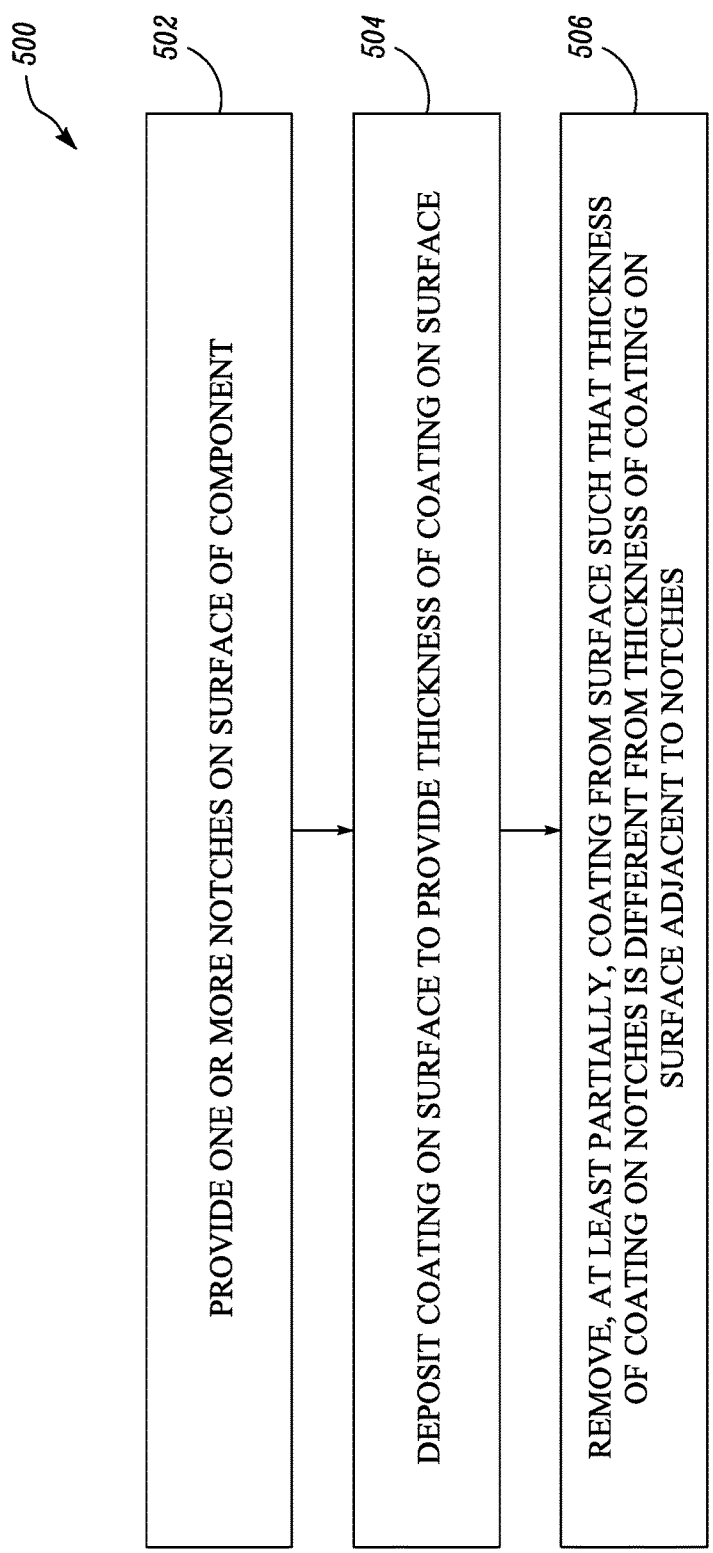
FIG. 5 illustrates a method for manufacturing a component, in accordance with an embodiment of the disclosure.

Referring to FIG. 5, an exemplary method 500 for manufacturing the busing 118, 118a is provided. The method includes a step 502. At the step 502, one or more notches 136, 136a are provided on the surface 134. The notches 136, 136a may be formed on the surface 134 by any suitable method, such as, but not limited to, machining, turning, additive manufacturing, casting, milling, etc., or in any combination thereof, known to a person skilled in the art.

In an embodiment (as shown in FIG. 3), protrusions are shown as notches 136. The protrusions may be formed on the surface 134 by performing a turning operation on the surface 134. The turning operation is performed to remove material from the surface 134 in such a manner that a relatively lesser material is removed at one or more locations on the surface 134 as compared to the rest of the surface 134. By doing so, notches 136 in the form of protrusions are formed on the surface 134 at the one or more locations. In an embodiment, the protrusions may be formed on the surface 134 by depositing a material on the surface 134 by additive manufacturing method such as by a 3D printing method.

In an embodiment (as shown in FIG. 4), grooves are shown as notches 136a. The grooves may be formed on the surface 134 by removing material from one more locations at the surface 134. The grooves may be formed by performing a turning operation at the surface 134. The grooves may be formed by removing more material at the one or more locations relative to rest of the surface 134. In an embodiment, the grooves may be formed on the surface 134 by performing a punching operation.

The method 500 further includes a step 504. At the step 504, a coating 138 is deposited on the surface 134. The coating 138 may be a thermal spray coating. Although, a thermal spray coating is contemplated, other suitable coatings known to a person skilled in the art may also be utilized. Deposition of the coating 138 may be performed by a process selected from the group consisting of a vapor deposition process, a sputtering deposition process, a plasma spray process, a high velocity oxygen fuel process, and a twin wire arc process.

Thereafter, the method 500 moves to a step 506. At the step 506, the coating 138 is removed partially from the surface 134. Removal of the coating 138 is performed so as to reduce the thickness of the coating 138 deposited over the surface 134. The coating 138 may be removed by performing a polishing operation on the coating 138. Although, the polishing operation is contemplated for removing the coating 138, other coating removal process, such as, but not limited to, a machining, a lathing, a grinding or any other suitable process, known in the art would also apply. The removal of the coating 138 from the surface 134 is performed in such a manner that the thickness of the coating 138 above the notches 136, 136a is different relative to thickness of the coating 138 above rest of the surface 134 or surface 134 adjacent to the notches 136, 136a. Thereby, creating the fracture zones 140, 140a over the notches 136, 136a, respectively. The removal of the coating 138 is performed in such a manner that a uniform thickness of the coating 138 from a top layer of the coating 138 is removed.

In an exemplary embodiment, the thickness of the coating 138 deposited over the surface 134 is 5 micrometer. During a removal process, such as a straight cut removal process performed linearly across the surface 134, a uniform thickness of 2 micrometer is removed from the surface 134. In doing so, the thickness of the coating 138 that remains over the notches 136 becomes less than 3 micrometer, whereas the thickness of the coating remaining over the rest of the surface 134 becomes 3 micrometer. In an another embodiment, the thickness of the coating 138 that remains over the notches 136 becomes zero micrometer, whereas the thickness of the coating 138 above the surface 134 adjacent to the notches 136 becomes 3 micrometer. Further, in case of the bushing 118a with notches 136a, the thickness of the coating 138 remaining above the notches 136a, after the removal process, becomes more than 3 micrometer as compared to the thickness of the coating 138 above the surface 134 adjacent to the notches 136a. Therefore, the removal of the coating 138 from the surface 134 creates fracture zones 140, 140a over the notches 136, 136a.

As the thickness of the coating 138 above the notches 136 becomes less than the thickness of the coating 138 on the surface 134 adjacent to the notches 136, weakened coating sections are created above the notches 136, thereby forming the fracture zones 140. Similarly, As the thickness of the coating 138 above the notches 136a becomes more than the thickness of the coating 138 on the surface 134 adjacent to the notches 136a, strengthened coating sections are created above the notches 136a, thereby forming the fracture zones 140a.

In an embodiment, the notches 136, 136a may be omitted. In such case, the fracture zones 140 may be formed directly over the coating 138 by removing coating 138 at least partially or completely at one or more locations on the surface 134. As coating material is removed, the thickness of the coating 138 at these locations becomes less than the thickness of the coating 138 adjacent to these locations, weakening the coating 138 at these locations, and leading to the creation of the fracture zones 140.

Conversely, the fracture zones 140a may be formed by depositing extra coating material at one or more locations over the coating 138, as well. As extra coating material is deposited, the thickness of the coating 138 at these locations becomes more than the thickness of the coating 138 adjacent to these locations, strengthening the coating 138 at these locations, and thus leading to the creation of fracture zones 140a adjacent to these locations.

Although the present disclosure details the application of the coating on the end face 126 of the bushing 118, 118a, it may be contemplated that fracture zones 140, 140a may be formed elsewhere on the bushing 118, 118a that requires a coating layer and which is prone to fractures caused perhaps due to repeated assembly and disassembly. Moreover, the bushing 118, 118a may be viewed as being exemplary in nature, and thus various other components that require a coating may also be similarly contemplated to include fracture zones to control chipping of associated coating.

INDUSTRIAL APPLICABILITY

During assembly, as the bushing 118, 118a is inserted into the bores 116 of the track links 106, a portion of the coating 138 may start to chip away from the surface 134. As the coating 138 on the surface 134 includes weakened and/or strengthened sections, termed as the fracture zones 140, 140a, it is most likely that a fracture of coating 138 may start to occur at the fracture zones 140, 140a. Fracture zones 140, 140a facilitate a portion of the coating 138 to break away rather uniformly from the bushing 118, 118a, while helping keep a substantial portion of the coating 138 intact over the surface 134 of the bushing 118, 118a. In that way, such a provision mitigates the chances of excess coating portions to be chipped away from the bushing 118, 118a, leading to increased durability and prolonged use of the bushing 118, 118a. Although an assembly of the bushing 118, 118a is explained, the fracture zones 140, 140a of the bushing 118, 118a similarly controls chipping of the coating 138 from the surface 134 during disassembly of the bushing 118, 118a with track links 106, as well.

Although the disclosure is explained in reference with the bushing 118, 118a of the track link assembly 100, the foregoing disclosure also finds utility in a variety of components such a track pin, bushing of a linkage assembly of a machine, a shaft etc., which includes coatings on one or more surfaces. Such components may be provided with fracture zones on an associated coating by a similar manufacturing method as that of the bushing 118, 118a to control chipping of the associated coating. Therefore, the disclosed embodiments may be used to prevent the chipping away of useful portions of a coating secured on a component that comes in contact with a surface, relative to which an assembly of the component is required.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof

What is claimed is:

1. A method for manufacturing a component, the method comprising:
   providing one or more notches on a surface of the component, such that each of the one or more notches has a predetermined length and a predetermined position on the surface of the component, such that each said predetermined position of the respective one or more notches is a respective predetermined distance from an end edge of the surface of the component, and such that no notch is at the end edge of the surface of the component;
   depositing a coating on the surface, on the one or more notches, to provide a thickness of the coating on the surface; and
   removing, at least partially, the coating from the surface, such that the thickness of the coating over each of the one or more notches is different from the thickness of the coating on the surface adjacent to the one or more notches,
   wherein one or more fracture zones for controlled fracture of the coating are defined by a change in the thickness of the coating at each of the one or more notches, the one or more fracture zones being configured to fracture only at the change in the thickness, and
   wherein the controlled fracture of the coating is such that a first predetermined portion of the coating, from a corresponding fracture zone of the one or more fracture zones to the end edge, breaks away from the surface of the component, while a second predetermined portion of the coating adjacent to the corresponding fracture zone remains intact on the surface, the second predetermined portion being greater in size than the first predetermined portion.

2. The method of claim 1, wherein said depositing the coating is performed by a process selected from a group consisting of a vapor deposition process, a sputtering deposition process, a plasma spray process, a high velocity oxygen fuel process, and a twin wire arc process.

3. The method of claim 1, wherein said removing the coating comprises one or more of machining, lathing, grinding, polishing.

4. The method of claim 1, wherein said providing the one or more notches comprises one or more of machining, additive manufacturing, turning, polishing.

5. The method of claim 1, wherein the coating is a thermal spray coating.

6. The method of claim 1, wherein the component is a bushing for a track link assembly.

7. The method of claim 1, wherein the coating has a zero thickness at each said predetermined position of the one or more notches.

8. The method of claim 1, wherein the surface is an end surface of a bushing.

9. The method of claim 1, wherein each of the one or more notches is a protrusion of a same height.

10. The method of claim 9, wherein the thickness of the coating over each of the one or more protrusions is less than the thickness of the coating over the surface adjacent to each of the one or more protrusions.

11. The method of claim 9, wherein the coating has a zero thickness at each said predetermined position of the one or more protrusions.

\* \* \* \* \*